(12) United States Patent
Liang et al.

(10) Patent No.: US 9,633,946 B1
(45) Date of Patent: Apr. 25, 2017

(54) SEAMLESS METALLIZATION CONTACTS

(71) Applicant: GLOBALFOUNDRIES INC., Grand Cayman (KY)

(72) Inventors: Jim Shih-Chun Liang, Poughkeepsie, NY (US); Domingo A. Ferrer, Fishkill, NY (US); Kathryn T. Schonenberg, Wappingers Falls, NY (US); Shahrukh Akbar Khan, Danbury, CT (US); Wei-Tsu Tseng, Hopewell Junction, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/140,121

(22) Filed: Apr. 27, 2016

(51) Int. Cl.
| | |
|---|---|
| *H01L 23/48* | (2006.01) |
| *H01L 23/52* | (2006.01) |
| *H01L 29/40* | (2006.01) |
| *H01L 23/532* | (2006.01) |
| *H01L 23/528* | (2006.01) |
| *H01L 23/522* | (2006.01) |
| *H01L 21/768* | (2006.01) |

(52) U.S. Cl.
CPC .. *H01L 23/53257* (2013.01); *H01L 21/76802* (2013.01); *H01L 21/76814* (2013.01); *H01L 21/76834* (2013.01); *H01L 21/76843* (2013.01); *H01L 23/528* (2013.01); *H01L 23/5226* (2013.01); *H01L 23/53209* (2013.01)

(58) Field of Classification Search
CPC ............. H01L 21/76843; H01L 23/485; H01L 21/76802; H01L 29/7848; H01L 21/76831
USPC ........ 257/754, 757, 758, 768, 769; 438/631, 438/637, 652, 655, 685
See application file for complete search history.

(56) References Cited

U.S. PATENT DOCUMENTS

| | | | |
|---|---|---|---|
| 6,734,090 B2 * | 5/2004 | Agarwala | ......... H01L 21/76801 257/E21.576 |
| 8,367,546 B2 | 2/2013 | Humayun et al. | |
| 8,435,894 B2 | 5/2013 | Chandrashekar et al. | |
| 2009/0280643 A1 * | 11/2009 | Andry | ............... H01L 21/76898 438/656 |
| 2011/0169131 A1 * | 7/2011 | Nakos | ............... H01L 29/66181 257/532 |
| 2016/0118356 A1 * | 4/2016 | Lo | .......................... H01L 24/05 257/621 |

* cited by examiner

*Primary Examiner* — S. V. Clark
(74) *Attorney, Agent, or Firm* — Anthony Canale; Andrew M. Calderon; Roberts Mlotkowski Safran Cole & Calderon, P.C.

(57) ABSTRACT

The present disclosure relates to semiconductor structures and, more particularly, to seamless metallization structures and methods of manufacture. A structure includes: a contact opening formed in an oxide material and in alignment with an underlying structure; a metal liner lining the sidewalls and bottom of the contact opening, in direct electrical contact with the underlying structure; a conductive liner on the metal liner, within the contact opening; and tungsten fill material on the conductive liner and within the contact opening.

20 Claims, 5 Drawing Sheets

SEAMLESS METALLIZATION CONTACTS

FIELD OF THE INVENTION

The present disclosure relates to semiconductor structures and, more particularly, to seamless metallization structures and methods of manufacture.

BACKGROUND

The fabrication of tungsten contacts requires the use of a metal liner with two components: a barrier layer and oxygen getter film. The barrier layer is commonly TiN and serves to avoid fluorine diffusion of a $WF_6$ precursor towards the oxygen getter ion metalized plasma (IMP) titanium, that is commonly used in the contact formation process.

However, the reaction of fluorine with Ti causes distortion of the profile at the top of the contacts for early pinch-off during W metal fill. This causes a hollow contact defect. This fluorine-titanium reaction can also disrupt the bottom of the contact to form titanium fluoride substances that can increase contact resistance (Rc). In an attempt to mitigate some of these issues, processes have used thicker TiN layer films. Although this may mitigate some of the issues, increasing the thickness can also bring a penalty in contact resistance by increasing the barrier to electron conduction.

SUMMARY

In an aspect of the disclosure, a structure comprises: a contact opening formed in an oxide material and in alignment with an underlying substrate; a metal silicide at the bottom of the contact opening and in direct contact with the underlying substrate; a first liner at the bottom of the contact opening in direct contact with the oxide material at the bottom of the contact opening and in direct contact with a portion of the metal silicide at a sidewall of the contact opening, the first liner not being in direct contact with the metal silicide in a middle of the contact opening; a metal liner lining the sidewalls and bottom of the contact opening, in direct contact with a portion of the oxide material and in direct contact with a portion of the metal silicide in the middle of the contact opening; and tungsten fill material within the contact opening.

In an aspect of the disclosure, a method comprises: forming a contact opening in an insulating layer to expose an underlying substrate; forming conductive liners within the contact opening and in contact with the substrate; forming an organic planarization layer on the conductive liners; removing exposed portions of the conductive liners on an upper surface and sidewalls of the contact opening; removing the organic planarization layer, exposing a surface of the conductive liners at a bottom of the contact opening; and filling a tungsten material within the contact opening.

In an aspect of the disclosure, a method comprises: depositing a sacrificial release layer on an insulating layer using a multi-cycle CVD process with different RF power treatments at different deposition layers of the sacrificial release layer; forming a contact opening through the sacrificial release layer and into the insulating layer, exposing an underlying epitaxial layer; forming conductive liners within the contact opening; forming a fluorine-free tungsten (W) layer on the conductive liners; and filling a tungsten material within the contact opening.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to seamless metallization structures and methods of manufacture. More specifically, the present disclosure provides seamless tungsten fill contact structures and methods of manufacture. Advantageously, by using the processes described herein, the contact structures will exhibit a reduction in tungsten keyholes that results from fluorine attack of Ti causing volume expansion and pinch-off of contact openings. Thus, the methods allow for seamless metal filling of contact openings. The process also eliminates residual Ti in the field area which is important because the residual Ti blinds the inspection techniques such that pinch off and resulting keyhole defects cannot be detected at a point in the process in which corrective action may be taken. Also, in embodiments, the contact structures will exhibit reduced tungsten keyhole due to profiling of the top sacrificial material, resulting in a larger opening for tungsten deposition within a contact opening. Also, an increase in tungsten volume will reduce lateral Rs due to less keyhole/voids/seams.

In embodiments, the methods described herein include using a sacrificial layer of material, e.g., nitride film, at the top of the structure, which can be used to tailor a top opening and hence mitigate defects. For example, in embodiments, a sacrificial nitride layer will etch faster than oxide below to allow for profile tuning to optimize tungsten fill. In addition, by implementing the processes described herein it is now possible to use a fluorine-free tungsten liner within the contact opening or make the TiN liner thinner.

The seamless metallization structures of the present disclosure can be manufactured in a number of ways using a number of different tools. In general, though, the methodologies and tools are used to form structures with dimensions in the micrometer and nanometer scale. The methodologies, i.e., technologies, employed to manufacture the seamless metallization structures of the present disclosure have been adopted from integrated circuit (IC) technology. For example, the structures are built on wafers and are realized in films of material patterned by photolithographic processes on the top of a wafer. In particular, the fabrication of the seamless metallization structures uses three basic building blocks: (i) deposition of thin films of material on a substrate, (ii) applying a patterned mask on top of the films by photolithographic imaging, and (iii) etching the films selectively to the mask.

Figure 1:
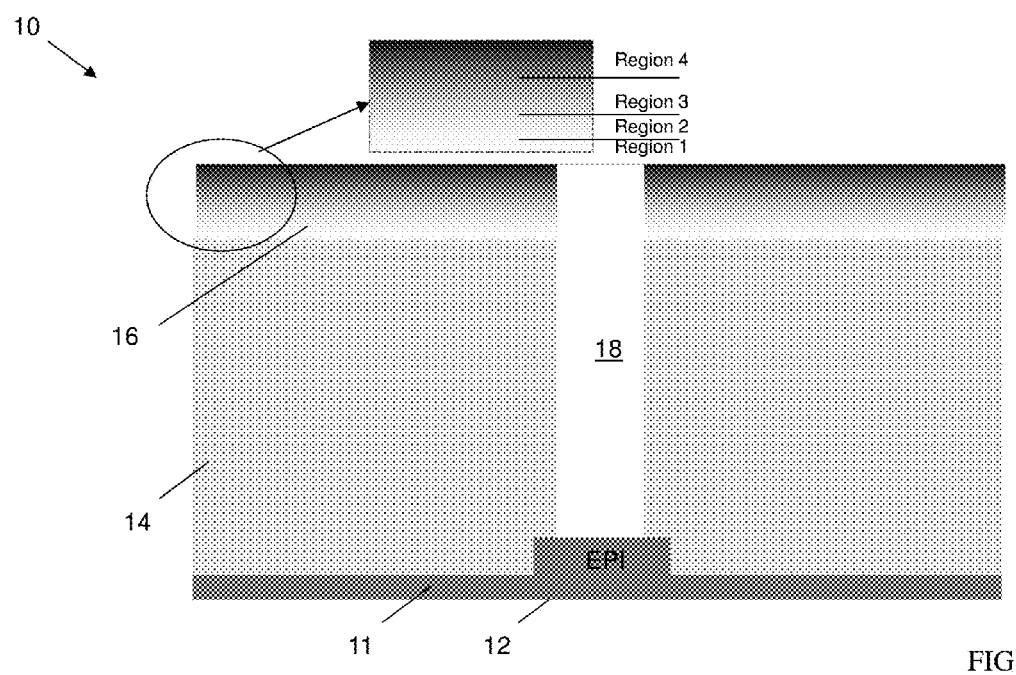
FIGS. 1-6 show respective structures and fabrication processes in accordance with aspects of the present disclosure.

FIG. 1 shows a structure and respective fabrication processes in accordance with aspects of the present disclosure. In particular, the structure 10 includes a Si fin 11 with an epitaxial source or drain contact 12. In embodiments, the epitaxial source or drain contact 12 can represent an NFET device or PFET device. In embodiments, the NFET device can be a phosphorous doped Si material; whereas, the PFET device can be a boron doped SiGe material. An insulating layer 14, e.g., oxide layer, can be deposited on the epitaxial source or drain contact 12 and Si fin 11. In embodiments, the insulating layer 14 can be deposited by a conventional deposition process, e.g., chemical vapor deposition (CVD).

Still referring to FIG. 1, a sacrificial release layer 16 is deposited on the insulating layer 14. The sacrificial release layer 16 can be a nitride material, and will have a higher etch rate in dilute HF (dHF) than the underlying insulating layer 14, for example an oxide. In embodiments, the sacrificial release layer 16 can be a silicon nitride material deposited using a multi-cycle CVD process treated at different power levels. For example, the sacrificial release layer 16 can be deposited using different RF power treatments at different deposition layers of the sacrificial release layer 16. More specifically, after each (or one or more) deposition cycle, the deposited layer of sacrificial material can be treated with a higher RF power, e.g., wattage, resulting in a higher etch rate at the top of the sacrificial release layer 16. Illustratively, a treatment of 800 watts will result in a higher etch rate than 400 watts, which would be applied to a lower portion of the sacrificial release layer 16. In this way, the etch rate of the sacrificial layer 18 can be tuned or graded, with the lowest etch rate at the bottom portion and a highest etch rate at the top portion of the sacrificial release layer 16.

In even more specific embodiments, the sacrificial nitride layer is a functionally graded material with desirable thickness of 5 nm/layer. In embodiments, the 5 nm layers of graded nitride material can serve to create a tapered sidewall of approximately 82 degrees in the metal contact. And, as described herein, each graded layer can be tailored to be sequentially less resistant to dHF to attain such angle.

As one illustrative non-limiting example, the RF range can be 400-800 W with four (4) regions of different thickness; although more or less regions are also contemplated herein with a similar concept to create a smoother top profile post dHF clean. More specifically, as shown in FIG. 1, in this illustrative non-limiting example, in region 1, there are two (2) deposition cycles (e.g., about 32 Å) with the lowest etch rate (ER) condition (e.g., length/time (angstroms/second) at 350 W-450 W. In region 2, there are three (3) deposition cycles (e.g., about 48 Å) with slightly higher ER at 500-600 W. In region 3, there are four (4) deposition cycles (e.g., about 64 Å) with yet slightly higher ER at 650-750 W. In region 4, six (6) deposition cycles (e.g., 96A) with even slightly higher ER than region 3 at 750 W-850 W can be utilized. As should be understood by those of skill in the art, this gradual grading of the film will allow the dHF to create a smooth transition from the middle of the line (MOL) oxide to the sacrificial release layer 16, e.g., nitride layer. In embodiments, the nitride minimizes any kinks that might promote tungsten (W) growth, which can prematurely close the contact before the metallization is complete.

A contact opening 18 is formed through the insulating layer 14 and sacrificial release layer 16, exposing the underlying substrate, which in embodiments can be an epitaxial source or drain 12. In embodiments, the contact opening 18 can be formed using conventional lithography and etching processes.

Figure 2:
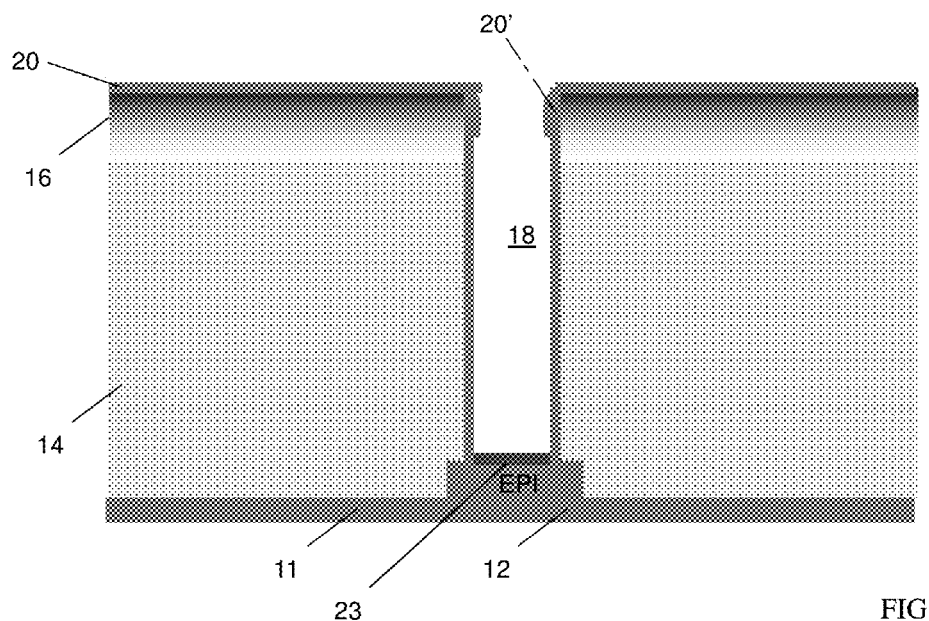

As shown in FIG. 2, a liner material 20 is formed in the contact opening 18 and over the sacrificial material 16. The liner material 20 can be Ti, Ni or Co material, deposited by a plasma vapor deposition (PVD) process. In embodiments, the PVD process will result in an overhang 20' at the top of the contact opening 18. The liner material 20 can be deposited to a thickness of about 8 nm on the horizontal surfaces of the contact opening 18; although, other thicknesses are contemplated by the present disclosure.

In embodiments where the exposed portion of the substrate is a source/drain or gate region, a sacrificial nitride liner may be formed in the contact opening 18. An anneal is performed to convert the Ti in contact with the substrate at the bottom of the opening to a silicide 23. The first liner and the metal silicide 23 comprise a common metal element. Subsequent to silicidation, the nitride liner may be removed with hot DHF.

Figure 3:
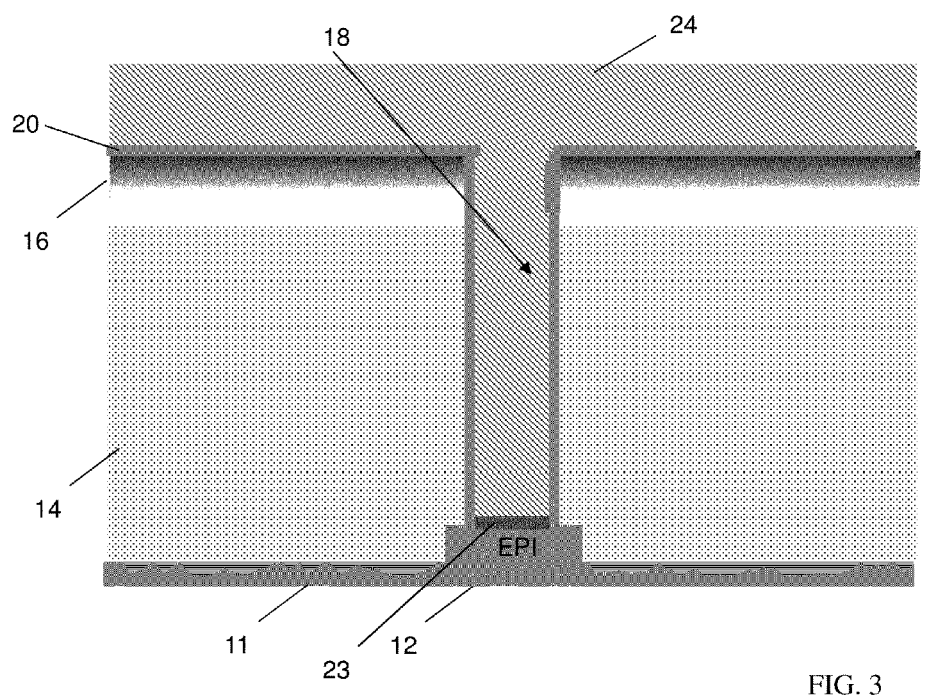

In FIG. 3, an Organic Planarization Layer (OPL) 24 is deposited within the contact opening 18, e.g., over the liner material 20. In embodiments, the OPL 24 will protect the underlying liner 20 within the contact opening 18, and more particularly, the bottom portion of the liner 20 which is in contact with the substrate, while still enabling Ti removal from the sidewall of the contact opening 18.

Figure 4:
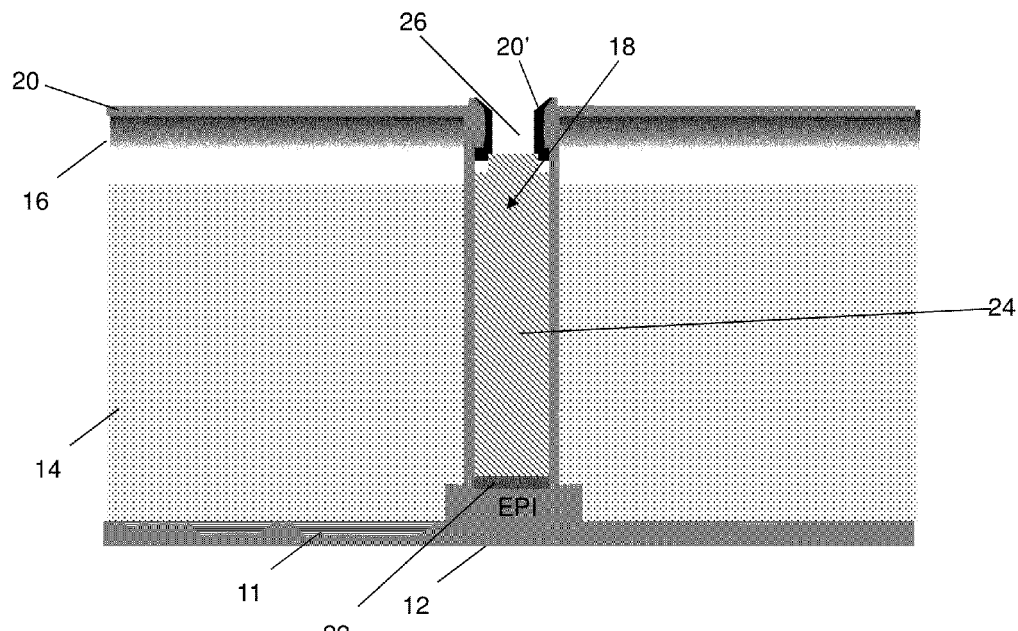

As shown in FIG. 4, the OPL 24 is partially removed or pulled down within the contact opening 18 to form a recess 26. In embodiments, the OPL 24 can be recessed using an ashing process, e.g., $N_2/H_2$ or $NH_3$ chemistry to prevent any oxidation of the liner 20. In one embodiment, the OPL 24 is preferably pulled down to below the Ti/TiN overhang 20', but above the interface of the sacrificial release layer 16 and the insulating layer 14. This will ensure that the OPL 24 remains within the contact opening 18 to protect the remaining portions of the liner 20. In other embodiments, the OPL 24 will be pulled down to just above the silicide so that the majority of the liner 20 on contact opening 18 sidewall is exposed.

Figure 5:
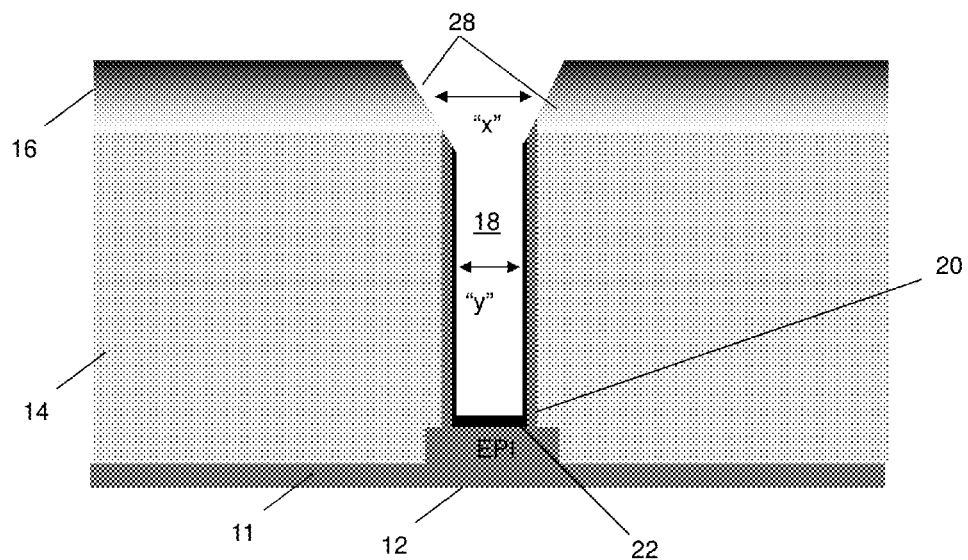
Figure 6:
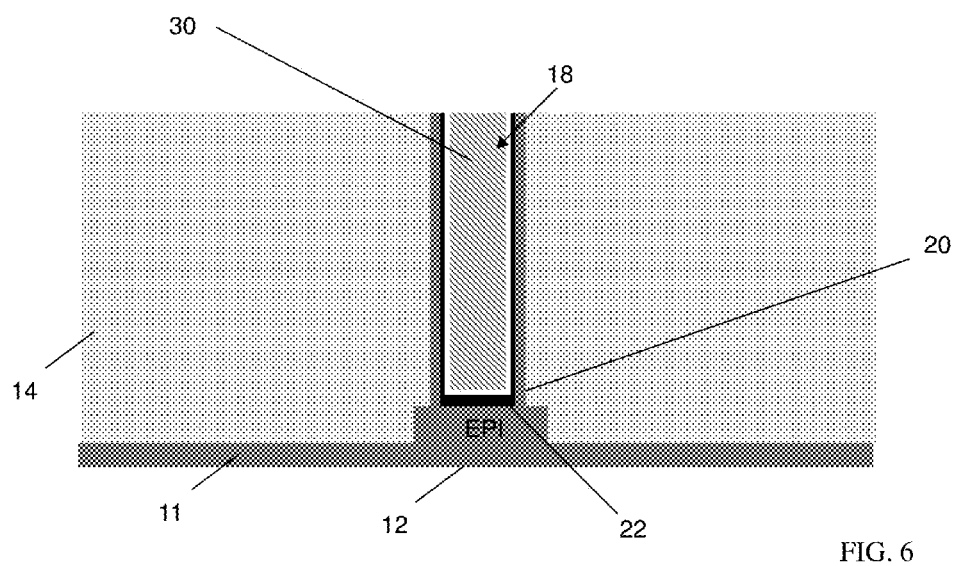

In FIG. 5, the liner 20 is removed from the top surface (field area) and the exposed sidewalls of the contact opening 18 use standard cleans. Any remaining ODL can be removed by an ashing process, e.g., with a reducing chemistry such as $N_2/H_2$ or $NH_3$ chemistry to prevent Ti oxidation. After each of these steps, there may be a residual liner 20 on the top surface of sacrificial layer 16. However, because sacrificial layer 16 is in place and a hot DHF can be used to remove the residual liner 20, the hot DHF removes a top layer of sacrificial layer 16 (the easier to etch layer) thereby releasing and residual liner 20. It also creates a taper 28, e.g., larger sized opening for easier W metallization. As should be understood by those of skill in the art, due to the higher etch rate of the sacrificial release layer 16 at a top portion thereof, the dimension "x" at the top of the contact opening 18 will be larger than the dimension "y" within the contact opening 18. Also, by having a larger opening, any chance of pinch off leading to W seam/voids inside the contact opening 18 can be reduced and, hence, result in improved contact resistance.

At this point there are two options for filling the contact opening 18. In one option, there is no need for a second TiN liner deposition process, thus avoiding any additional defects. Instead, a liner of fluorine free W is formed in the opening 18 followed by ultra-low resistivity tungsten (uLRW) 30 using a $WF_6$ deposition process. The structure then undergoes a chemical mechanical polishing (CMP) to remove overlying uLRW, liner 20 and 16 thereby forming the contact 30 in direct electrical communication with the substrate, which may be an epitaxial layer 12 (e.g., NFET or PFET device). In a second option, the liner 20 is TiN followed by uLRW and CMP. Here, the TiN may be very thin because there is no Ti remaining in the field areas, thus attack of Ti by fluorine of the W deposition causing defects is not an issue.

The resulting structure will be a seamless W contact in an insulator having either a TiN or a fluorine free W liner on the sidewalls and bottom. The insulator may be oxide or may be oxide with a top layer of nitride. The bottom of the contact will have a silicide between the W fill and the substrate. The sidewalls of the bottom of the contact will have a ring of liner 20 adjacent the silicide metal 23.

Figure 7:
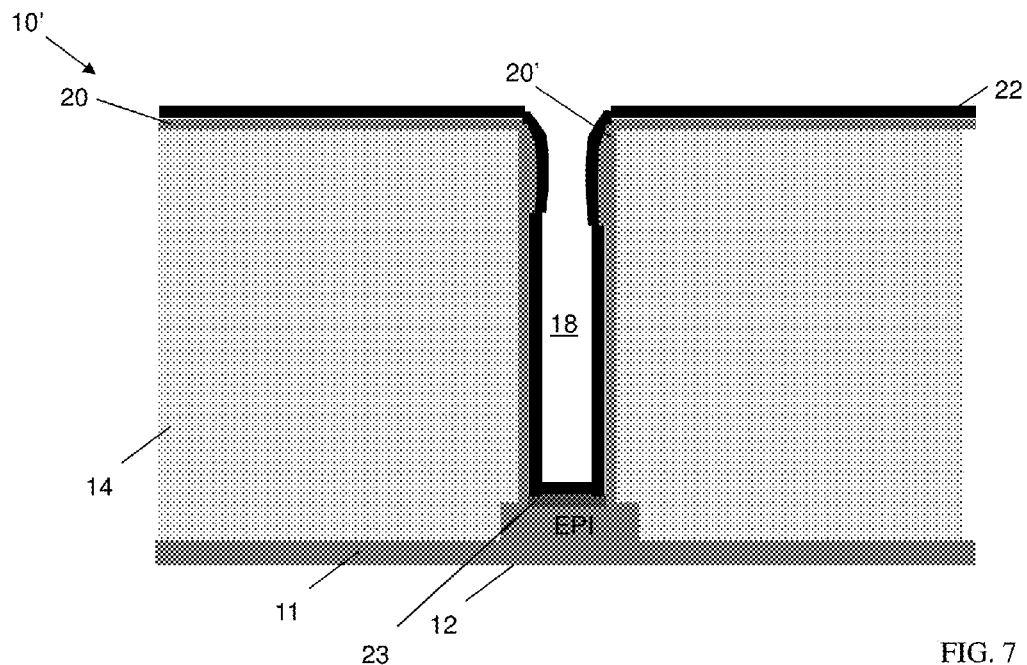
FIGS. 7-9 show respective structures and fabrication processes in accordance with additional aspects of the present disclosure.
Figure 8:
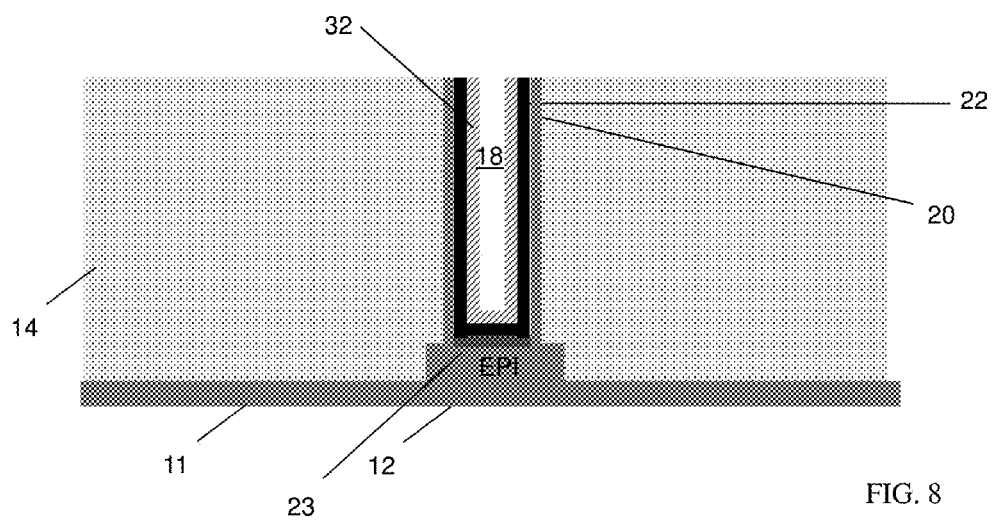
Figure 9:
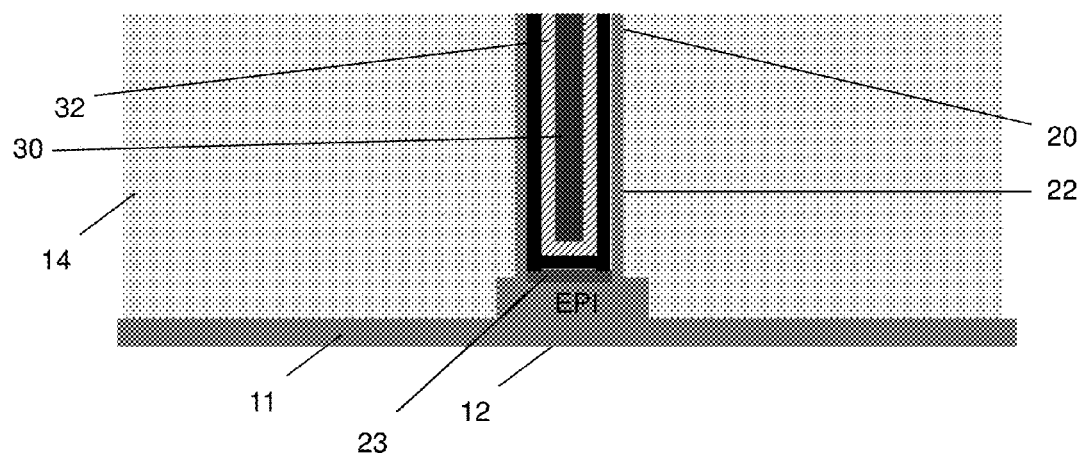

FIGS. 7-9 show respective structures and fabrication processes in accordance with additional aspects of the present disclosure. In FIG. 7, the structure 10' includes a substrate which may comprise an epitaxial source or drain contact 12. In embodiments, the epitaxial layer 12 can represent an NFET device or PFET device. In embodiments, the NFET device can be a phosphorous doped Si material; whereas, the PFET device can be a boron doped SiGe material. An insulating layer 14, e.g., oxide layer, can be deposited on the epitaxial source drain 12 and Si fin 11. In embodiments, the insulating layer 14 can be deposited by a conventional deposition process, e.g., chemical vapor deposition (CVD).

Still referring to FIG. 7, a contact opening 18 is formed through the insulating layer 14, exposing the underlying epitaxial source or drain contact 12. In embodiments, the contact opening 18 can be formed using conventional lithography and etching processes as already described herein. A liner material 20 is formed in the contact opening 18 and over the insulating layer 14. The liner material 20 can be a Ti, Ni, or Co material, deposited by a plasma vapor deposition (PVD) process. In embodiments, the PVD process will result in an overhang 20' at the top of the contact opening 18. The liner material 20 can be deposited to a thickness of about 8 nm on the horizontal surfaces of the contact opening 18; although, other thicknesses are contemplated by the present disclosure. An optional metal liner 22, e.g., TiN or fluorine-free tungsten W, can be deposited over the liner material 20, using conventional deposition processes. In embodiments, the optional metal liner 22 can block fluorine.

FIG. 8 shows a polished structure in accordance with aspects of the present disclosure. Specifically, as shown in FIG. 8, a fluorine-free tungsten (W) layer 32 is deposited on optional metal liner 22 and the structure is then polished. In embodiments, the fluorine-free tungsten (W) layer 32 will not have any fluorine to react with Ti. The fluorine-free tungsten (W) layer 32 serves as a protection layer during the polishing step which removes the overhand and thus leaving a contact having substantially vertical sidewalls.

The fluorine-free tungsten (W) layer 32 and liners 20, 22 can be removed from a top surface of the structure, e.g., over the insulating layer 14, using a highly-selective touch-up CMP process to stop on the insulating layer 14 (oxide or nitride) with minimum erosion as described herein. The touch up CMP includes a two-step process comprising a first acidic polish, preferable pH about 4 or less and/or a chemistry which forms a protective oxide layer. The second step includes cleaning with a surfactant and a neutral to basic pH, in some embodiments the H is from 7-9, in others greater than 9. In addition, a corrosion inhibitor may be added to the second step. A dilute HF (dHF) can be used to clean the surface of the insulating layer 14, which will release surface defects. This cleaning process will also have no impact on the critical dimensions, as it will be fixed by the metal materials, e.g., fluorine-free tungsten (W) layer 32 and liners 20, 22.

In FIG. 9, the contact opening 18 is filled with another layer of fluorine-free tungsten to act as an adhesion layer between the oxide on the top surface and ultra-low resistivity W (uLRW) 30 that is subsequently deposited. The structure then undergoes a chemical mechanical polishing (CMP) to form the contact 30, in direct electrical communication with the epitaxial layer 12 (e.g., NFET or PFET device).

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising:
    a contact opening formed in an oxide material and in alignment with an underlying substrate;
    a metal silicide at the bottom of the contact opening and in direct contact with the underlying substrate;
    a first liner at the bottom of the contact opening in direct contact with the oxide material at the bottom of the contact opening and in direct contact with a portion of the metal silicide at a sidewall of the contact opening, the first liner not being in direct contact with the metal silicide in a middle of the contact opening;
    a metal liner lining the sidewalls and bottom of the contact opening, in direct contact with a portion of the oxide material and in direct contact with a portion of the metal silicide in the middle of the contact opening; and
    tungsten fill material within the contact opening.

2. The structure of claim 1, wherein the first liner is selected from the group consisting of Ti, Co and Ni.

3. The structure of claim 2, wherein the first liner is TiN.

4. The structure of claim 2, wherein the first liner comprises tungsten.

5. The structure of claim 2, wherein the first liner is of uniform thickness in the contact opening.

6. The structure of claim 2, wherein the first liner and the metal silicide comprise a common metal element.

7. The structure of claim 4, wherein the conductive liner is a fluorine free liner.

8. A method comprising:
    forming a contact opening in an insulating layer to expose an underlying epitaxial layer;
    forming conductive liners within the contact opening;
    forming an organic planarization layer on the conductive liners and in contact with the epitaxial layer;
    removing exposed portions of the conductive liners on an upper surface and sidewalls of the contact opening;
    removing the organic planarization layer, exposing a surface of the conductive liners at a bottom of the contact opening; and
    filling a tungsten material within the contact opening.

9. The method of claim 8, further comprising pulling down the organic planarization layer within the contact opening to expose a surface of the conductive liners prior to the removing of the exposed portions of the conductive liners on upper portions of the sidewalls of the contact opening.

10. The method of claim 8, wherein the conductive liners comprise Ti and TiN.

11. The method of claim 8, wherein the conductive liners comprise Ti and fluorine free tungsten.

12. The method of claim 8, further comprising forming the contact opening through a sacrificial release layer formed on the insulating layer.

13. The method of claim 12, wherein the sacrificial release layer is deposited using a multi-cycle CVD process with different RF power treatments at different deposition layers of the sacrificial release layer.

14. The method of claim 13, wherein the different RF power treatments comprise a higher RF power in an upper portion of the sacrificial release layer than in a lower portion, resulting in a higher etch rate at the upper portion of the sacrificial release layer than in the lower portion.

15. The method of claim 14, further comprising enlarging an opening of the contact opening within the sacrificial release layer in the upper portion, prior to the filling of the tungsten material within the contact opening.

16. The method of claim 8, further comprising removing the sacrificial release layer and tungsten material outside of the contact opening after deposition of the tungsten material within the contact opening using a metal to oxide selectivity to stop on oxide with minimum erosion, and with low to neutral pH to avoid excessive W dissolution and hollow metal formation.

17. A method comprising:
depositing a sacrificial release layer on an insulating layer using a multi-cycle CVD process with different RF power treatments at different deposition layers of the sacrificial release layer;
forming a contact opening through the sacrificial release layer and into the insulating layer, exposing an underlying epitaxial layer;
forming conductive liners within the contact opening;
forming a fluorine-free tungsten (W) layer on the conductive liners; and
filling a tungsten material within the contact opening.

18. The method of claim 17, wherein:
the different RF power treatments comprise a higher RF power in an upper portion than in a lower portion of the sacrificial release layer, resulting in a higher etch rate in the upper portion of the sacrificial release layer; and
forming an opening in the contact opening that is larger at the upper portion than in other portions of the contact opening.

19. The method of claim 17, further comprising removing the fluorine-free tungsten (W) layer on the conductive liners from a top surface of the insulating layer using a highly-selective touch-up chemical mechanical planarization (CMP) process to stop on the insulating layer.

20. The method of claim 17, wherein CMP includes a two-step process comprising a first acidic polish of pH about 4 or less and/or a chemistry which forms a protective oxide layer and a second step including cleaning with a surfactant and a neutral to basic pH.

* * * * *